United States Patent
Brennan et al.

(10) Patent No.: US 10,331,821 B1
(45) Date of Patent: *Jun. 25, 2019

(54) AUTOMATIC VARIABLE FIDELITY SIMULATION

(71) Applicant: MSC.Software Corporation, Newport Beach, CA (US)

(72) Inventors: Douglas Brennan, Newport Beach, CA (US); Douglas James Neill, Irvine, CA (US); Herbert Dennis Hunt, Green Cove Springs, FL (US); Kunaseelan Kanthasamy, Irvine, CA (US)

(73) Assignee: MSC.Software Corporation, Newport Beach, CA (US)

( * ) Notice: Subject to any disclaimer, the term of this patent is extended or adjusted under 35 U.S.C. 154(b) by 641 days.

This patent is subject to a terminal disclaimer.

(21) Appl. No.: 14/672,786

(22) Filed: Mar. 30, 2015

Related U.S. Application Data

(63) Continuation of application No. 13/339,323, filed on Dec. 28, 2011, now Pat. No. 8,996,342.

(51) Int. Cl.
*G06F 17/50* (2006.01)

(52) U.S. Cl.
CPC .............. *G06F 17/5018* (2013.01)

(58) Field of Classification Search
CPC .................................... G06F 17/5018
See application file for complete search history.

(56) References Cited

U.S. PATENT DOCUMENTS

| | | | |
|---|---|---|---|
| 6,683,613 B1 | 1/2004 | Herbstman et al. | |
| 8,996,342 B1 * | 3/2015 | Brennan | G06F 17/5095 703/13 |
| 2004/0128117 A1 | 7/2004 | Crandall et al. | |
| 2005/0171745 A1 | 8/2005 | Breitfeld et al. | |
| 2008/0126067 A1 | 5/2008 | Haas et al. | |
| 2008/0303817 A1 * | 12/2008 | Kataoka | G06T 17/20 345/423 |
| 2009/0215011 A1 | 8/2009 | Christensen et al. | |
| 2010/0004912 A1 * | 1/2010 | Guist | G06F 17/5018 703/7 |
| 2010/0017171 A1 | 1/2010 | Spilker et al. | |

OTHER PUBLICATIONS

U.S. Office Action dated Oct. 31, 2014, from related U.S. Appl. No. 13/339,323.
U.S. Office Action dated Mar. 19, 2014, from related U.S. Appl. No. 13/339,323.
U.S. Office Action dated Aug. 4, 2014, from related U.S. Appl. No. 13/339,323.
U.S. Notice of Allowance dated Jan. 28, 2015, from related U.S. Appl. No. 13/339,323.

\* cited by examiner

*Primary Examiner* — Dwin M Craig
(74) *Attorney, Agent, or Firm* — Foley & Lardner LLP (57) ABSTRACT

A method, apparatus and computer readable medium for performing a computer simulation a physical object, includes receiving at least one selection by a user with respect to usage of a simpler model or a more complex model to be used to model at least one attribute of the physical object; performing a computer simulation of the physical object based on the at least one selection received from the user; and rerunning the computer simulation a plurality of times using results obtained from earlier run computer simulations, to obtain an accurate representation of the physical object.

14 Claims, 10 Drawing Sheets

AUTOMATIC VARIABLE FIDELITY SIMULATION

CROSS-REFERENCE TO RELATED PATENT APPLICATIONS

This application is a Continuation of U.S. patent application Ser. No. 13/339,323, filed Dec. 28, 2011, issued as U.S. Pat. No. 8,996,342 on Mar. 31, 2015, which is incorporated herein by reference in its entirety.

BACKGROUND

1. Field of the Disclosure

This disclosure relates generally to apparatus and methods for simulations of mechanical objects.

2. Related Art

Predicting behavior of mechanical objects is important in order to assess the operability of those mechanical objects over time. Typically, the predicted behavior is done by way of computer simulations of the mechanical objects.

One such way of predicting behavior of mechanical objects is by using a finite element method, which is used to predict the behavior of one or more physical objects in a virtual environment. The finite element method involves five basic steps:
  1. Creation of the finite element model, typically, but not always from geometry design imported from computer-aided design (CAD) systems.
  2. Enhancement of the finite element model with material, property, load and constraint attributes.
  3. Transformation of the attributed model into a formatted file suitable for consumption by a finite element solver.
  4. Transformation of the information contained within the formatted solver files into a set of equations and subsequent solution of these equations by the finite element solver.
  5. Post-processing of the results from the solution of the equations.

In general, steps 1 thru 3 of the finite element mode rarely yield a valid simulation at the first attempt. Further, users frequently discover modeling deficiencies or errors after completion of Steps 4 and 5 that have to be corrected by partially repeating steps 1 thru 3. This cycle of build, solve, review, fix is generally executed numerous times before a valid model and solution is obtained.

To reduce the number of iterations required, conventional approaches have utilized manual creation of multiple models, each with increasing levels of complexity. A user would build a simple model, attribute, solve and post-process that model to establish modeling deficiencies and errors. After correction of any errors on the model, the user would then construct subsequent models, each with additional attribution or complexity and repeat the pattern of build/solve/review/fix at each level of complexity before finally repeating that pattern on a full fidelity model. Even with this approach, the number of iterations required can be fairly significant, as well as the time expended by the user to construct a plurality of models with increased complexity to finally realize a full fidelity model.

As such, much time is generated in order to come up with an accurate behavior simulation model, which can lead to fairly expensive simulation procedures in terms of user time and computation resources expended. It is desirable to come up with a way to lessen the time and number of iterations required to come up with an accurate behavior simulation model using the finite element method.

SUMMARY OF THE DISCLOSURE

Various embodiments are directed to providing a more efficient and faster computer simulation of a physical object using a finite element model approach.

In various other embodiments, the method for performing a computer simulation of a physical object includes receiving at least one selection by a user with respect to usage of a simpler model or a more complex model to be used to model at least one attribute of the physical object; performing a computer simulation of the physical object based on the at least one selection received from the user; and rerunning the computer simulation a plurality of times using results obtained from earlier run computer simulations, to obtain an accurate representation of the behavior of the physical object.

In various other embodiments, a non-transitory computer readable medium stores computer program product which, when executed by a computer, causes the computer to perform the functions of: receiving at least one selection by a user with respect to usage of a simpler model or a more complex model to be used to model at least one attribute of the physical object; performing a computer simulation of the physical object based on the at least one selection received from the user; and rerunning the computer simulation a plurality of times using results obtained from earlier run computer simulations, to obtain an accurate representation of the behavior of the physical object.

In various other embodiments, an apparatus for modeling a physical object includes a receiving unit configured to receive user input with respect to parameters of a physical object to be simulated, as well as information as to whether the user wants to use one or more simpler model representations for modeling a physical object. The apparatus also includes a finite element modeling unit configured to perform modeling of the physical object based on the user input. The finite element modeling unit is configured to use one or more simple submodels and one or more complex submodels in performing the simulation: The apparatus further includes an output unit that outputs results of the simulations performed by the finite element modeling unit.

DETAILED DESCRIPTION

The detailed description set forth below in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The detailed description includes specific details for providing a thorough understanding of the present disclosure. However, it will be apparent to those skilled in the art that the present disclosure may be practiced without these specific details. In some instances, well-known structures and devices are shown in block diagram form in order to avoid obscuring the concepts of the present disclosure. Acronyms and other descriptive terminology may be used merely for convenience and clarity and are not intended to limit the scope of the present disclosure.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Various embodiments of a finite element method for use in modeling behavior of one or more physical objects are described herein below.

The finite element method can be used to approximate the response of a real physical product or object, and offers the user control over the degree of approximation that is applied. In general, the accuracy of the predicted system response improves as the number of simplifying assumptions decreases. It is also the case that the complexity of the model, time required to generate a solution and system (compute) resources all increase as the user reduces simplifying assumptions and explicitly defines more accurate model, attribution and environmental effects. To this end, embodiments of the invention operate to automatically reduce simplifying assumptions in order to speed up the simulation process to arrive at an accurate model for modeling physical behavior of one or more objects.

Some examples of reducing simplifying assumptions that may be utilized in a finite element method according to a first embodiment include:

Explicit definition and solution of nonlinear material behavior and large displacement/large rotation effects in place of the simpler linear material, small deflection/rotation assumptions.

Explicit definition and solution of contact conditions between disparate parts of a model in place of user defined constraints.

Explicit modeling of bolts, washers and bolt pre-load effects in place of simple point-to-point linear connections.

Coupled thermal/structural simulation in place of procedural chained thermal and structural simulations.

As previously mentioned, the finite element method is capable of producing more accurate results as the user more accurately defines the structure, attribution and load environment of the product under investigation. The downside to the definition of these additional attributes and behaviors is increased model complexity and longer run times. Since the typical simulation workflow involves multiple iterations of the build, solve, review, fix workflow, the impact of the increased run times can lead to exponentially longer total simulation time (that is, the time from initial model to obtaining validated results).

The invention according to the first embodiment reduces the total simulation time by automatically creating and solving simplified models from complex models. The simplified models are used by the user to establish the validity of the model, as well as its attribution and load environment. The inventor has determined that, for many moderately complex models, some (but not all) basic modeling errors and assumptions can be discovered through solution of simplified representations. Use of a simplified model in the simulation debugging phase allows for faster cycle times between creation of the candidate model and discovery/correction of modeling deficiencies and errors.

To this end, the first embodiment provides for automatic creation of simple models from complex models, including, but not limited to the following simplifications of the finite element model:

1. Creation and simulation of rigid body models from flexible body models.
2. Creation and simulation of coarse mesh models from fine mesh models.
3. Creation and simulation of linear connections from nonlinear connections.
4. Creation and simulation of linear models from nonlinear models.

Figure 1:
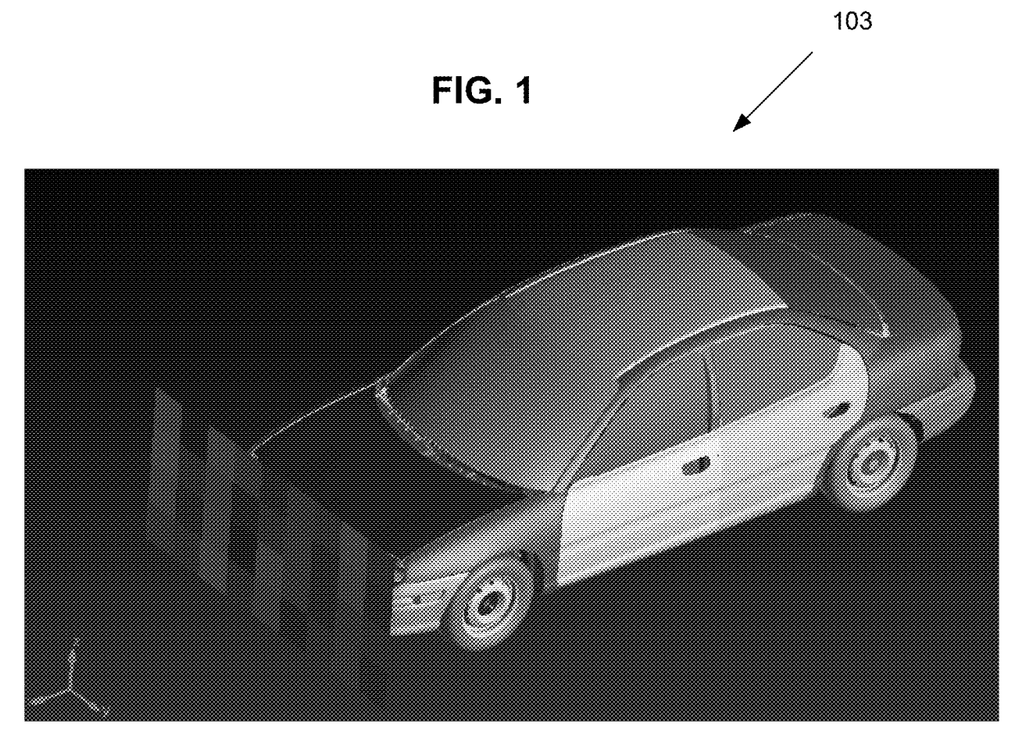
FIG. 1 shows an image of a finite element model of a car and a crash barrier model that can be utilized in determining behavior characteristics of the car according to one or more embodiments.
Figure 2:
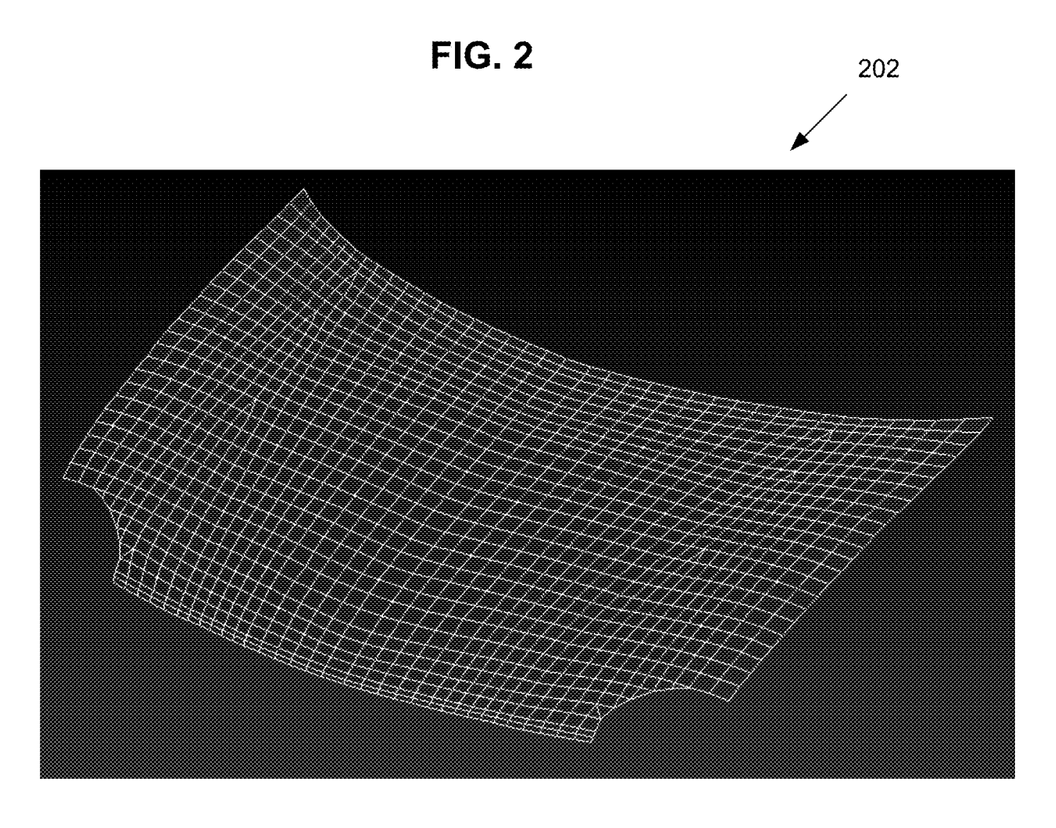
FIG. 2 shows a fine mesh model of a hood of the car that can be utilized in determining behavior characteristics of the car according to one or more embodiments.

An example of a simplification of a model is described in detail below. FIG. 1 shows an image of a finite element model representation 103 of a car and a crash barrier, to be used in determining behavior characteristics of the car due to the car crashing into the crash barrier. FIG. 2 shows a finite element model representation of the hood of the car, using a high fidelity, fine mesh model representation 202 of the hood. Each "square" in FIG. 2 corresponds to a single finite element. Each finite element has a node at its vertex, and each node has a plurality of degrees of freedom associated with it (e.g., six degrees of freedom). The compute time required to solve this model is proportional to the number of degrees of freedom in the model, and so in general as the number of elements decreases so does the number of nodes and hence the number of degrees of freedom.

Figure 3:
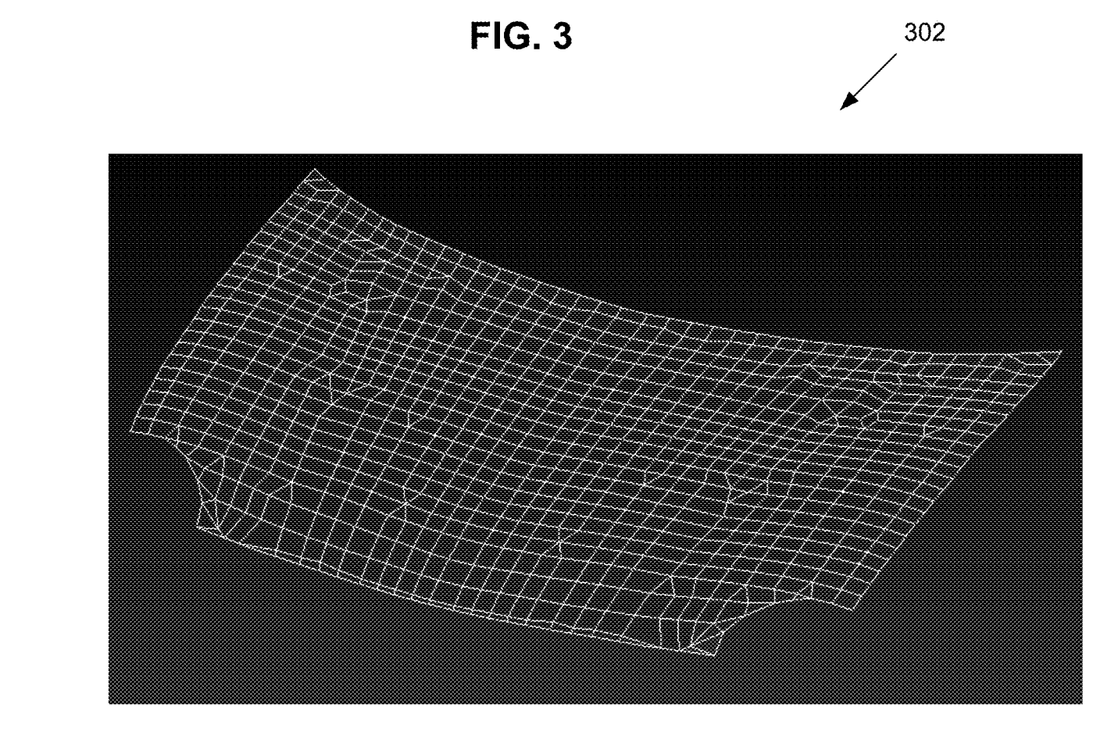
FIG. 3 shows an intermediate mesh model of the hood of the car that can be obtained by a simplifier utilized in determining behavior characteristics of the car in at least one iteration of an automatic variable fidelity simulation of a finite element model according to one or more embodiments.
Figure 4:
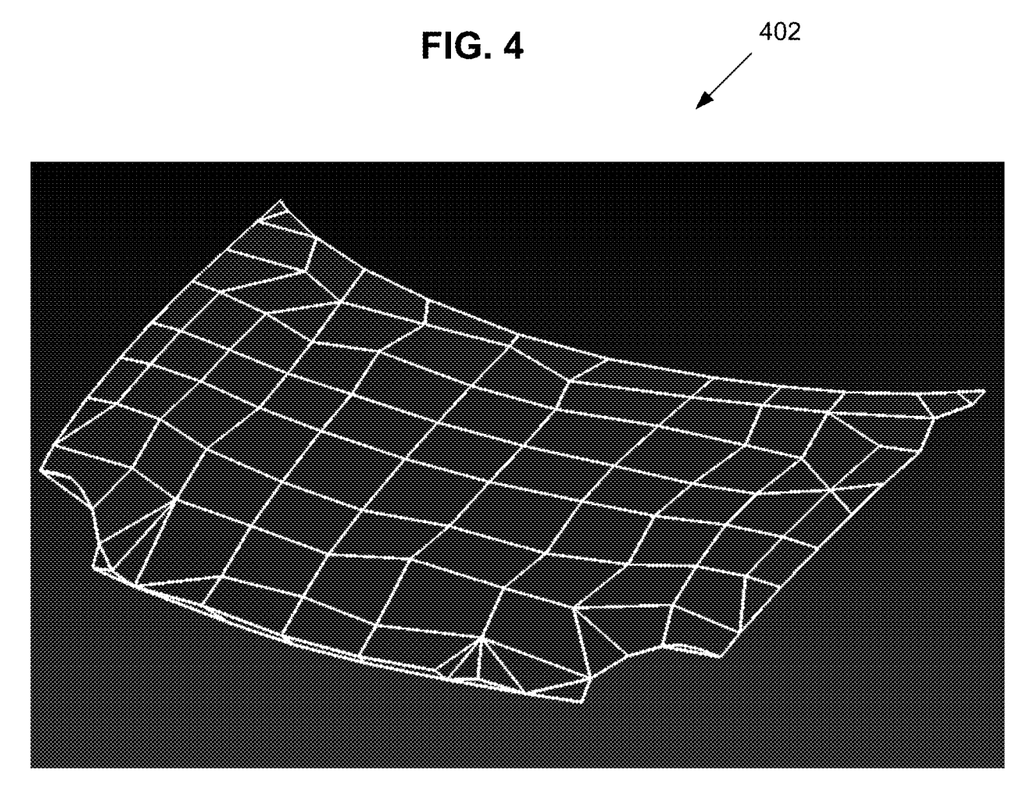
FIG. 4 shows a coarse mesh model of the hood of the car that can be obtained by the simplifier utilized in determining behavior characteristics of the car in at least one iteration of an automatic variable fidelity simulation of a finite element model according to one or more embodiments.

FIG. 3 shows an intermediate mesh model representation 302 of the hood, and FIG. 4 shows a coarse mesh model representation 402 of the hood, in which the coarse mesh model has fewer elements, nodes and degrees of freedom than the intermediate mesh model (which in turn has fewer elements, nodes and degrees of freedom than the fine mesh model of the hood). Each of these models is capable of representing the behavior of the hood as it is subjected to loads; however, the accuracy of the results usually degrades as the model becomes coarser. The advantage of the coarse model is that it requires much fewer compute resources and will solve in much less time than the finer models.

At least one embodiment of the invention automatically generates reduced fidelity (coarse) meshes from the initial (fine) meshes, updates all part-to-part connections to ensure that the original part connectivity is preserved, updates all material, property, load and constraint definitions to ensure that they are correctly applied to the coarse mesh, and solves the reduced fidelity model to produce results for the user. The reduced fidelity model, solution and results are maintained alongside the original high fidelity model. For example, in a first iteration of the finite element model that corresponds to running the most simplified object model, a car having a hood modeled using a coarse mesh model representation 402 as shown in FIG. 4 is utilized for determining the behavioral characteristics of the car. Then in a next iteration of the finite element model, a car having a hood modeled using the intermediate mesh model representation 302 as shown in FIG. 3 is utilized for determining the behavioral characteristics of the car. Meanwhile, the original high fidelity model of the car that utilizes a hood modeled using the fine mesh model representation 202 as shown in FIG. 2 for determining the behavioral characteristics of the car is being run, whereby due to its complexity, the time it takes to complete its run is much longer than the simpler models being run concurrently in separate iterations.

The reduced fidelity model obtained based on implementing embodiments of the invention can be considered as a proxy for the high fidelity model, in that the user can review the results and solver diagnostics from the reduced fidelity model to check for modeling deficiencies that can be corrected on the high fidelity model, prior to submitting the high fidelity model for solution or while the high fidelity model is still running. If no modeling deficiencies are indicated by the reduced fidelity model, the user will at the very least gain some insight into the behavior of the product being simulated.

A rigid body representation of the hood of the car as opposed to a flexible body representation of the hood of the car can be utilized in a simplified model of the car according to embodiments of the invention. The rigid body representation exhibits no stiffness within the part, and is basically the lowest fidelity representation that is possible to achieve for modeling the part. Nonetheless, in a model that includes a plurality of parts, each part being connected to other parts by flexible connections, this minimal fidelity representation as obtained from implementation of various embodiments of the invention can still provide valuable insight into the viability of more complex models.

The creation of simpler models from complex models in accordance with at least one embodiment of the invention involves direct creation of the most complex form of the model by the user, and then subsequently automatically generating less complex models that can be used to "validate" the modeling approach using simulation techniques that can be completed in significantly less time than simulation of the most complex model.

Generation of the simpler models from the more complex models in accordance with embodiments of the invention can be performed in a variety of ways. An example is provided below for simplifying a fine mesh mode into a coarse mesh model by use of a simplifier. For those parts of the model that represent the primary physical structure (as opposed to the parts that connect the primary physical structures together), the most complex representation is generally a finite element mesh with a global element size of "x" (see FIG. 2, for example). For each contiguous mesh region in the model, a simplification procedure performed by the simplifier according to at least one embodiment of the invention generates an alternate mesh with a larger global element size, say 5× (five times) in size (see FIG. 3, for example). The inputs to the simplifier are the initial fine contiguous mesh region and the coarsening factor to be applied (e.g., 5). From those inputs, the simplifier outputs a coarse mesh model, such as creating the coarse mesh model representation 402 of the hood as shown in FIG. 4 or the intermediate mesh model representation 302 of the hood as shown in FIG. 3 from the fine mesh model representation 202 of the hood as shown in FIG. 2.

By way of example, a mesh can be defined by a plurality of nodes, with each node having an identifier (e.g., a unique ID) and a spatial location (e.g., x,y,z coordinate, and reference coordinate frame), and a set of element definitions (e.g., an element has a type or topology, e.g., triangular element or quadrilateral element), and a connectivity to other nodes (e.g., quadrilateral element connects to four other nodes). The simplifier receives this input data for a complex, fine mesh model of an object, such as a hood of a car, and outputs a set of mesh data with a lesser number of nodes as was included in the input data. As a result, the amount of data used to represent the object, in this case a hood of a car, is reduced by using the coarser mesh model, and hence the processing time for a model that simulates the behavior of the car is consequently reduced. In this example, all other parts of the car may be kept the same as before, with only the hood of the car simplified, or alternatively one or more other parts of the car can be simplified by the simplifier (e.g., applying a linear approximation to a car part as opposed to a more complex non-linear approximation to that car part) when constructing input data to a finite element model for a particular iteration.

Applying the same coarsening technique to all, or a subset of the various parts in the model (e.g., the various parts of a car), in accordance with embodiments of the invention, can result in a substantial reduction of the time required to solve the entire model. Although the results obtained from a coarse model do not have the same accuracy as the results from a finer model, there is almost always some valuable information that can be extracted.

Using this approach, any level of mesh coarsening can be achieved by a simplifier operating in accordance with embodiments of the invention. As another example of a simplifier that performs simplification of a flexible body model into a rigid body model in accordance with embodiments of the invention, generation of a rigid body representation of a flexible body representation can be achieved by at least two different approaches. In a first approach, the properties of the finite elements that represent the primary structure of a part can be modified such that they no longer represent flexible behavior, in which this approach will substantially reduce computational time while still retaining the use of the finite element solver. A second approach is to generate a rigid body representation of a contiguous mesh region of a part, which involves determining the mass of the contiguous mesh region and its center of gravity. Based on this determined information, a rigid body object suitable for solution using multi-body dynamics solution methods can be generated by the simplifier and used as a simplified rigid body model of a flexible body object.

Figure 5:
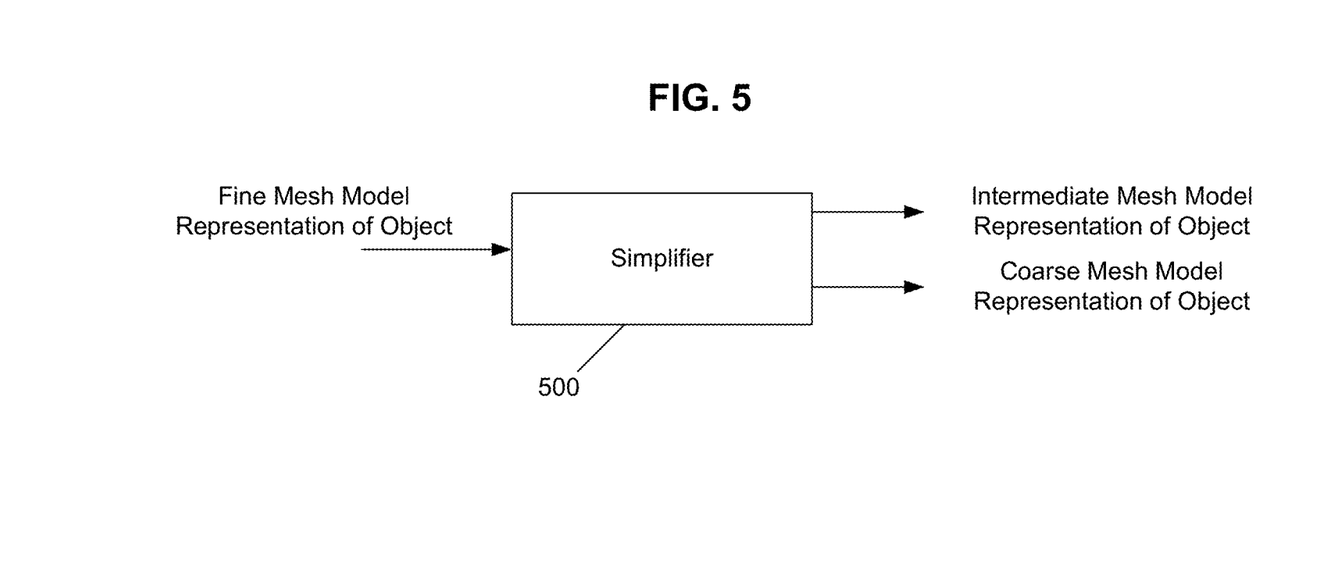
FIG. 5 shows a simplifier that can be utilized to create simplified objects for use in one or more embodiments of the invention.

FIG. 5 shows a simplifier 500 that can be utilized to create simplified objects for use in one or more embodiments of the invention. In particular, the simplifier 500 receives an input a high fidelity model representation of an object, which in this case is a fine mesh model representation of a hood of a vehicle (see the mesh model representation 202 shown in FIG. 2, for example). The simplifier 500 outputs an intermediate mesh model representation of the hood of the vehicle (see the mesh model representation 302 shown in FIG. 3, for example) and a coarse mesh model representation of the hood of the vehicle (see the mesh model representation 402 shown in FIG. 4, for example), for use in a simplified model representation of the hood of the vehicle in order to determine behavioral characteristics of the vehicle.

Figure 6:
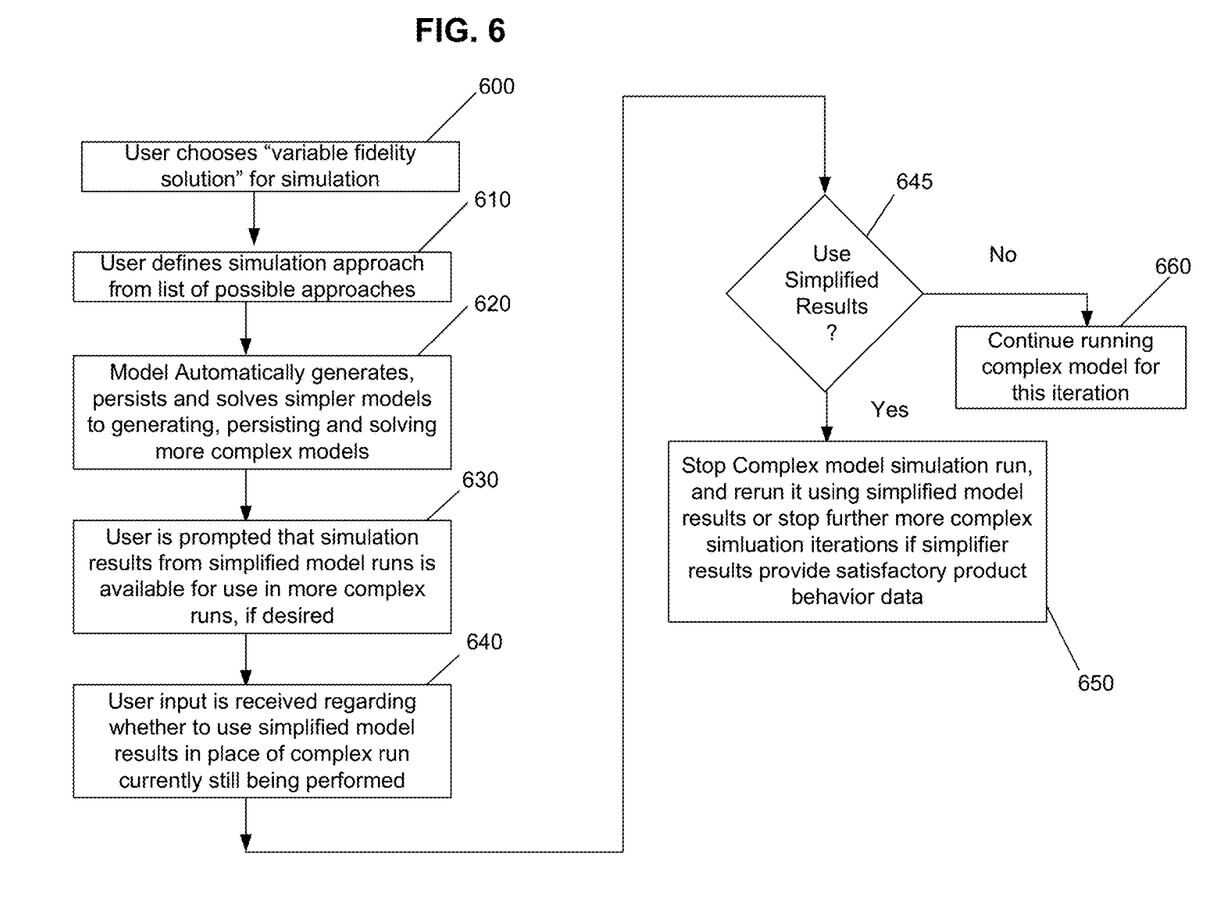
FIG. 6 shows the steps involved by a user in initiating the automatic variable fidelity simulation of a finite element model according to a first embodiment.

FIG. 6 shows the steps involved by a user in initiating the automatic variable fidelity simulation of a finite element model according to a first embodiment. In a step 600, the user chooses "Variable fidelity solutions" (as opposed to "Normal operation") in order to speed up the finite element modeling process by using one or more simplified models. In a step 610, the user defines his/her ultimate simulation approach from a list of simulation approaches, such as selection of one or more of the following approaches: nonlinear finite element analysis (FEA), large displacement, coupled thermal-structural, etc. In a step 620, as the user builds a primary model to support his/her ultimate simulation approach, the system automatically generates, persists and optionally solves simpler models in parallel to the primary model (that uses more complex models). The models and their solutions can be carried out in parallel, as in the first embodiment, or models and their solutions can be carried out sequentially, as in the second embodiment to be discussed in detail below. In either case, the simplest representation is generated and solved first, in which the insight gained from the simplest model is used to adjust the next more complex model representation, etc., until the highest required fidelity model (the primary model) is finally solved. In a step 630, as simulation data for the simplified models becomes available, the system prompts the user and makes him/her aware of the availability of supporting simulation data obtained from the use of the simpler models being run in parallel to the more complex models (that take more time to complete). In some embodiments, the results from the simpler solution model is not used directly, but rather the user reviews the results of the simpler solution model and assesses the validity of that model based on those results. Based on any erroneous or behavior noted in the simpler solution model, the user may adjust the modeling approach of the next most complex model to be run, and so the use of results from a simpler solution model is indirect, and not direct. In a step 640, the user is provided with the option to update his/her finite element model (the primary model) using the supporting simulation data obtained from the simpler finite element model that had finished earlier than the more complex finite element model currently running. If in step 645 the user elects to use the supporting simulation data obtained from the simpler finite element model, in a step 650, the more complex finite element model is halted and rerun using the supporting simulation data in the process of building a valid model, or the simulation iteration procedure is completed and no further more complex simulation models are run if the simulation data obtained from the simpler simulation model are deemed by the user to be satisfactory. If in step 645 the user does not elect to use the supporting simulation model, then step 660 is performed in which the more complex finite element model continues to run to completion.

Figure 7:
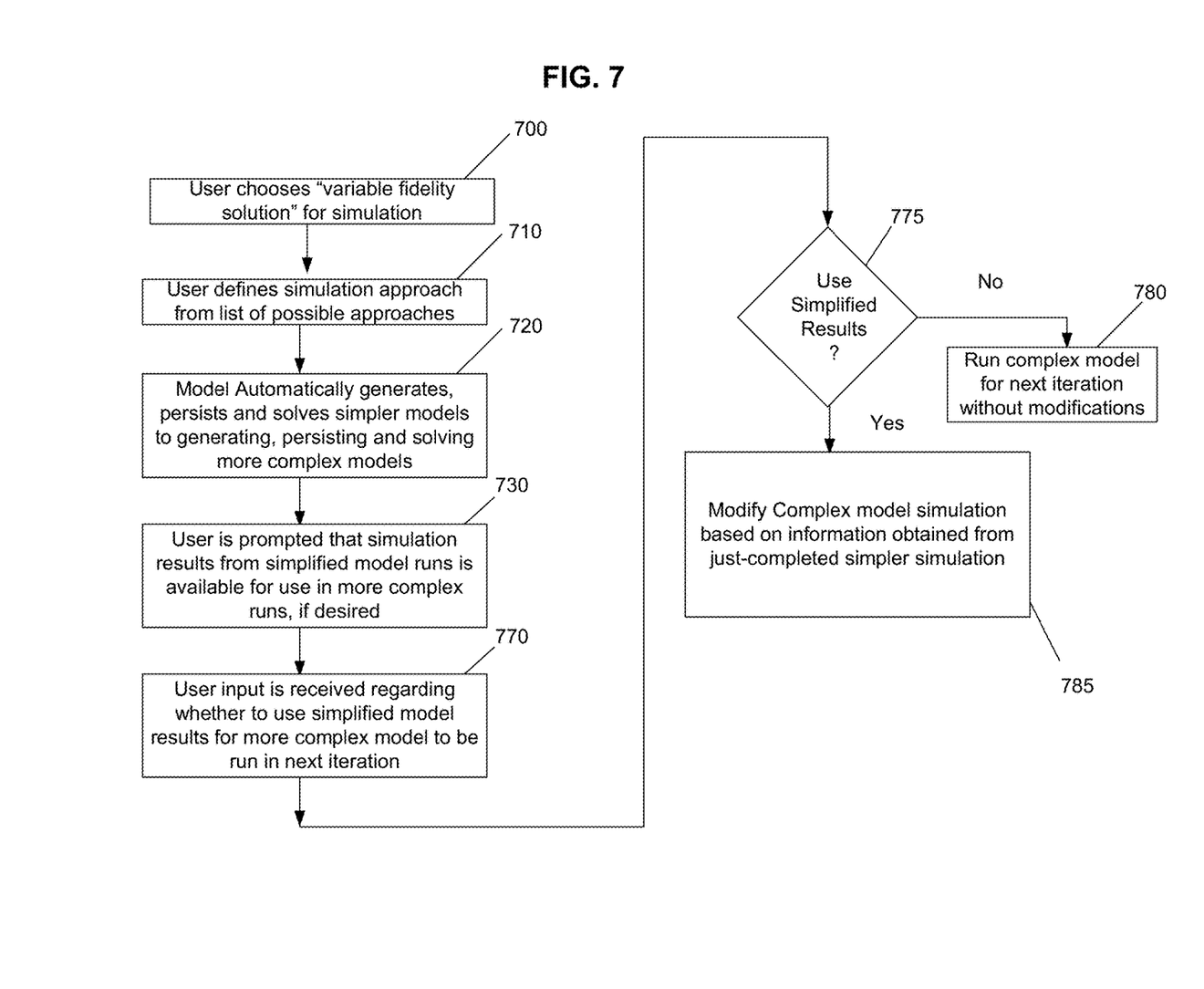
FIG. 7 shows the steps involved by a user in initiating the automatic variable fidelity simulation of a finite element model according to a second embodiment.

FIG. 7 shows the steps involved by a user in initiating the automatic variable fidelity simulation of a finite element model according to a second embodiment. The second embodiment is different from the first embodiment in that the simulations are performed sequentially starting with the simplest model and working its way up to the most complex (high fidelity) model. The second embodiment can be used in cases where the processing capability is not as powerful as the first embodiment, in which multiple simulations can be run at the same time (in parallel) in the first embodiment. In the second embodiment, steps 700, 710, 720 and 730 are respectively the same as steps 600, 610, 620 and 630 in the first embodiment, and are not discussed here for sake of brevity. In step 770, after completion of a simulation, user input is received regarding whether to use the just-completed simplified model results for a more complex model to be run in a next iteration. If in step 775 it is determined to use the just-completed simplified model results for the more complex model to be run in the next iteration, then in step 785 the more-complex model simulation to be run next is modified based on information obtained from the just-completed simpler model simulation. If in step 775 it is determined to not use the just-completed simplified model results for more complex model to be run in the next iteration, then in step 780 the more-complex model simulation to be run in the next iteration is not modified based on the results obtained from the just-completed simpler model simulation.

In some embodiments of the invention, the user acceptance or non-acceptance of a simpler simulation is utilized as a go-nogo gate for subsequent execution of the next-most complex simulation to be performed. If the simpler simulation indicates a modeling problem, the user can adjust the modeling approach (on the next-most complex model definition), whereby the user can cause the simpler simulation to be re-executed to make sure that the adjustments have corrected the problem. In cases where the simpler simulation is assessed by the user to be valid, then either: a) the next-most complex simulation can be executed (with a higher degree of confidence that it will succeed), or b) the user may decide that the simpler simulation provides enough insight to make a decision about the performance of the product being simulated and that the next-most complex simulation is no longer required. This can relate, for example, to an obvious failure of the product design to meet the requirements rather than an obvious ability to meet the requirements, whereby the user can then proceed accordingly with respect to product redesign.

Figure 8:
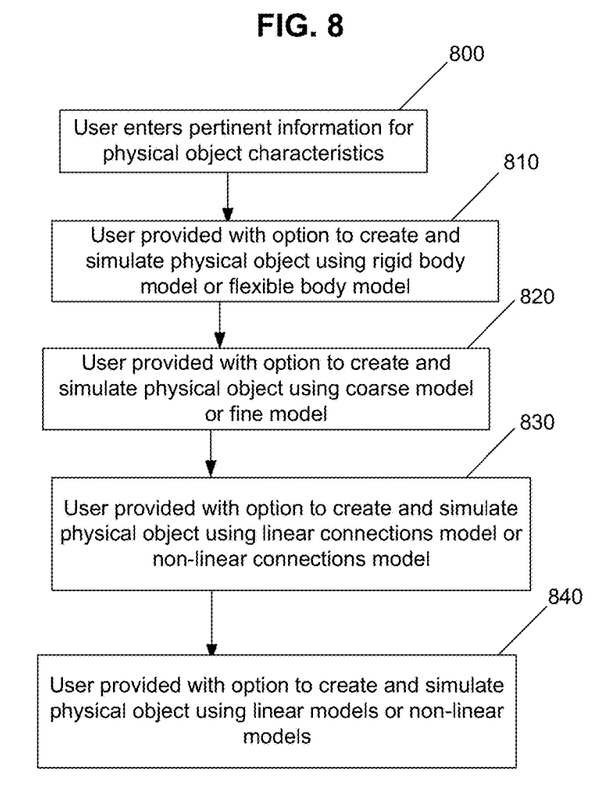
FIG. 8 shows the steps involved by a user for entering information with respect to performing the automatic variable fidelity simulation of a finite element model according to the first or second embodiments.

As an example of a model for which behavior is to be predicted using a finite element model according to the first or second embodiments, a simulation is to be performed on an aircraft wing having 1,000 rivets that are coupled to the wing, and that has two engines also coupled to the wing by way of 100 bolts, for flying conditions at 600 miles per hour and at 35,000 feet in altitude. Referring now to FIG. 8, in stage 800, the user enters the pertinent physical information of the wing as provided above (and which may also include more details on the specific components attached to the wing, such as size and shape and material construction). In stage 810, the user is provided with the option to create and simulate the wing by using a rigid body model as opposed to a flexible model. In stage 820, the user is provided with the option to create and simulate the rivets attached to the wing using a coarse mesh model as opposed to a fine mesh model. In stage 830, the user is provided with the option to create and simulate the coupling of the engines to the wing using linear connections as opposed to non-linear connections. In stage 840, the user is provided with the option to create and simulate the wing structure suing linear models as opposed to non-linear models. For each of these options, the selection of the simpler model results in a faster running of the finite element model, and provides simulation results that can then be input to a more complex finite element model for a next iteration of the physical object simulation procedure.

Figure 9:
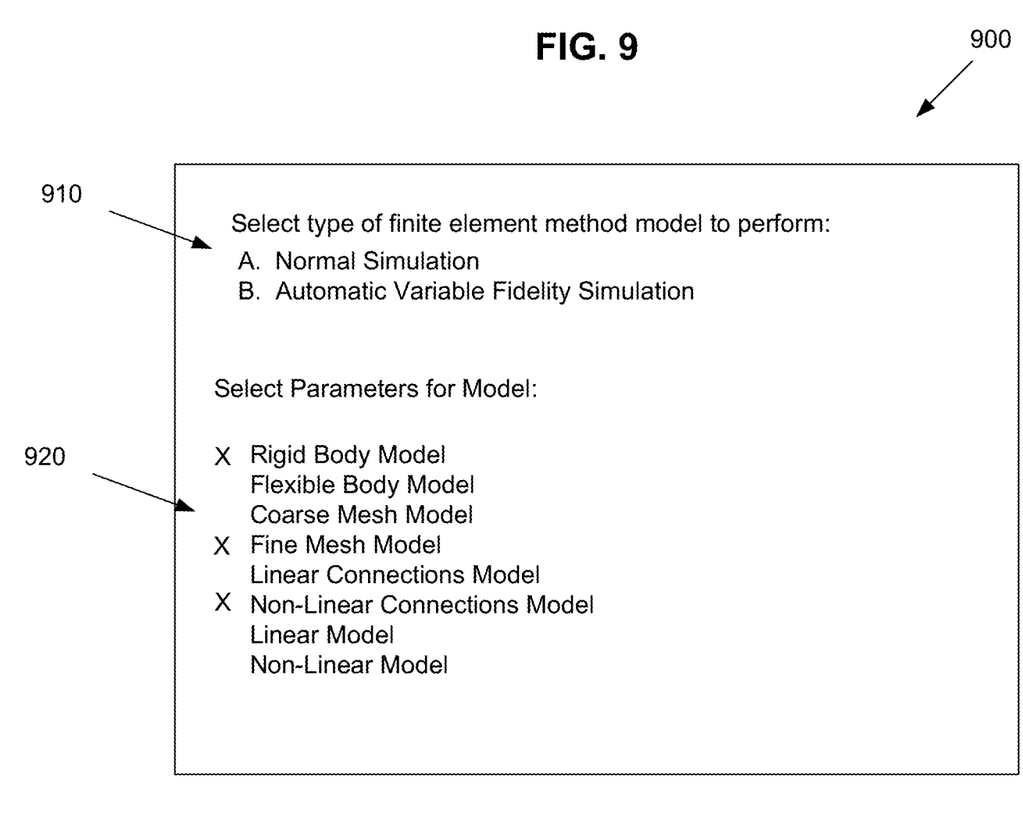
FIG. 9 shows a graphical user interface that can be used to receive user input according to the first or second embodiments.

FIG. 9 shows a graphical user interface 900 that can be used to receive user input according to the first or second embodiments. In a first region 910, the user can select to either perform a normal finite element model simulation, or an automatic variable fidelity simulation. In a second region 920, the user can select various simple or complex models to use in the automatic variable fidelity simulation. In the example shown in FIG. 9, the user has selected (by way of "X"s provided next to the corresponding option) to user the rigid body model, the fine mesh model, and the non-linear connections model. Since the user did not make a select with respect to linear model or non-linear model, the system defaults to the use of the more complex non-linear model.

Figure 10:
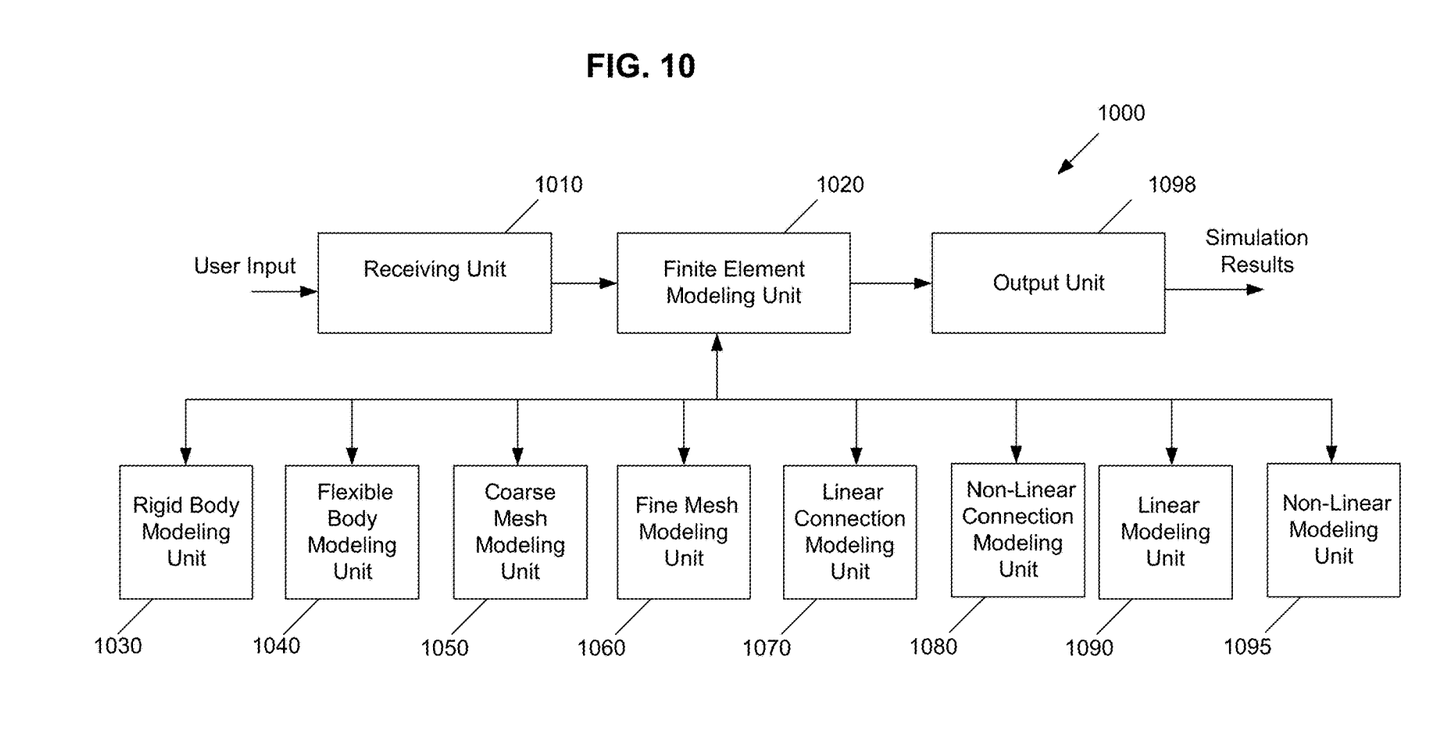
FIG. 10 shows an apparatus that can be used to implement the first or second embodiments.

FIG. 10 shows an apparatus 1000 that can be used to implement the first or second embodiments. A receiving unit 1010 receives user input with respect to parameters of a physical object to be simulated, as well as information as to whether the user wants to use one or more simpler model representations for modeling a physical object. A finite element modeling unit 1020 performs modeling of the physical object based on the user input. The finite element modeling unit 1020 utilizes one or more of the following submodels in performing the simulation: rigid body modeling unit 1030, flexible body modeling unit 1040, coarse mesh modeling unit 1050, fine mesh modeling unit 1060, linear connection modeling unit 1070, nonlinear connection modeling unit 1080, linear modeling unit 1090, and nonlinear modeling unit 1095.

Description of how the rigid body modeling unit 1030 creates a rigid body model from a flexible body model is described herein. Simplification of a "fine" flexible finite element mesh to a rigid body representation can be achieved in either of two ways. A first way corresponds to substitution of flexible finite element behavior with rigid finite element behavior. For this first way, the inputs are to the rigid body modeling unit 1030 are: original finite element mesh, original element property definition, and original flexible material definition. Typically, the flexible behavior of individual elements is governed by the element property definition which in turn references a definition of a flexible material—a material that has finite stiffness. Based on these inputs, the rigid body modeling unit 1030 executes a conversion process. In particular, the rigid body modeling unit 1030 can automatically and internally adjust all element property definitions and replace those parts of the property definition that define flexible behavior with attributes that define rigid behavior. In many cases, this may simply involve replacing the reference to the flexible material with a reference to a rigid material. The exact element properties vary depending on the target element type—solid tetrahedral, sold hexahedra, shell and bat elements etc. However, the pattern can be generalized to remain applicable to all element types. The outputs of the rigid body modeling unit 1030 according to this first way are: the original finite element mesh, new element property definitions, and new material property definitions that replace the original element and material property definitions. The original property and material definitions can also be retained for future use.

The rigid body modeling unit 1030 can also create a rigid body model from a flexible body model according to a second way, in which flexible finite element behavior is substituted with a rigid body. In more detail, the inputs to the second way of creating a rigid body model are: original finite element mesh, original element property definition, and original flexible material definition. The conversion process executed by the rigid body modeling unit 1030 according to this second way of creating a rigid body model corresponds to determining the mass, center of mass, and inertia properties of the initial finite element mesh based on the element and material properties of that mesh. If the original mesh is referenced by one or more contact definitions, the system may also generate a geometric representation of the original mesh (for example, a Parasolid representation). If the original mesh is referenced by an external connection (e.g., spot weld, seam weld, bolt, etc.), then the rigid body modeling unit 1030 can automatically generate attachment points on the rigid body (i.e., part coordinate frames of hardpoints) in the same locations as those that exist on the original finite element mesh. The outputs of the rigid bodying modeling unit 1030 executing this second way of creating a rigid body model are the rigid body representation described above with respect to the first way, and optionally a Parasolid, STL or other geometric definition of the shape of the body. Further, one or more external connection points defined as multibody coordinate frames or hardpoints can be optionally output as well.

Description of how the coarse mesh modeling unit 1050 creates a coarse mesh model from a fine mesh model is described herein. The inputs to the coarse mesh modeling unit 1050 are the original "fine" mesh (e.g., nodes and elements), and all element and material properties referenced by that mesh. Mesh size is generally described using a nominal length dimension. For a given mesh, this nominal length may represent a key dimension of the element such as the edge length. A fine mesh does not have an absolute definition of edge length; rather, it uses a shorted edge length than a "coarse mesh". Whether or not a mesh is considered fine or coarse is application dependent.

The conversion process performed by the coarse mesh modeling unit 1050 on the fine mesh input data is such that the coarse mesh modeling unit 1050 generates a new mesh, with a larger nominal element size than the original mesh. The new mesh occupies the same nominal position in space and has the same boundary shape as the original mesh, except where the longer element edge length prohibits the new mesh boundary exactly following the original mesh boundary. The edge length of the new coarse mesh can be calculated automatically by the coarse mesh modeling unit 1050 based on constraints defined by default settings or provided by the user prior to or during generation of the original fine mesh. The constraints may be defined explicitly as a multiplier on the original nominal mesh size or indirectly based on a target element or degree of freedom count reduction or other method.

If the original mesh is referenced by one or more load or constraint definitions, the coarse mesh modeling unit 1050 can ensure that the new coarse mesh includes load/constraint support locations at the same locations that exist in the original fine mesh. In some embodiments, the coarse mesh modeling unit 1050 may also generate new, duplicate definitions of all original load and constraint definitions, and may reference those load and constraint definitions to the new coarse mesh.

Additionally, if the original mesh is referenced by one or more contact definitions, the coarse mesh modeling unit 1050 may generate duplicate contact body definitions referencing the new coarse mesh. The contact definitions may be derived from the contact definitions that are referenced to the original fine mesh. The coarse mesh modeling unit 1050 may also generate duplicate element and material property definitions, based on the original element property and material definitions associated with the fine mesh and will associate them to the newly generated coarse mesh.

The outputs of the coarse mesh modeling unit 1050 are: 1) the newly generated coarse mesh (node and element definitions), 2) new, duplicate, element and material property definitions that reference the new coarse mesh, 3) optionally, new, duplicate load and constraint definitions that reference the new coarse mesh, and 4) optionally, new duplicate contact definitions that reference the new coarse mesh. The original fine mesh, element and material properties, load and constraint definitions and contact definitions can also be retained and/or output for future use.

Operation of the linear connection modeling unit 1070 and how it creates a linear connection model from a nonlinear connection model is described herein. Before that, the reasons why such a linear connection modeling unit 1070 is useful for speeding up simulation time are described below. In the simulation of assemblies (e.g., models comprised of two or more individual parts), the use of connection technology is commonplace. Many different types of connections are available for the user to choose from, ranging from the simple point to point "rigid" connections that simply the constrain the displacement of one end of the connection to match that of the other end, through linear flexible point to point connections that join the two ends using a flexible element, through mesh independent connections that do not require individual nodes to exist at the exact end points of the connection, through simple nonlinear point to point or mesh independent connections to fully built up 3D "models" of bolted connections, include contact between the bolt head/nut/washer and the joined parts—with or without nonlinear pre-loading and load response behavior. As the fidelity of the connection increases, the solution time required to calculate the response of the system increases. Simulations that include large numbers of high fidelity, nonlinear connections can substantially increase the overall run time of the simulation. In many cases, particularly during initial model validation runs, the user can save a substantial amount of time by replacing the high fidelity/computationally expensive connection models with a simpler/computationally cheaper connection model until such time as the behavior of the model has been validated an d corrected at which point the higher fidelity connection model can be reinstated and used for the final, high fidelity simulations.

A range of substitutions is possible depending on which "high fidelity" connector is initially chosen. The inputs, process and outputs described here with respect to the linear connection modeling unit 1070 are generalized to cover many different types of possible replacement strategies. The choice of replacement strategy may be defined using a set of system defaults that will define the connection type or types that will be used for each connection supported by the system. Additionally, users may be able to override the system defaults (e.g., factory defaults) with their own replacement strategy, if needed.

The inputs to the linear connection modeling unit 1070 may include the original high fidelity connector definition and properties, the list of "parts", elements, nodes or features that the connection is being used to join, the location and orientation in space at which the connection is positioned, any element or material properties that are required or used by the connector and any preload information that may be relevant to the connector.

The processing performed by the linear connection modeling unit 1070 is such that, for each connection in the model, the linear connection modeling unit 1070 establishes the target "simplified" connection type by looking up the default connection replacement type from the system/user defaults. If the connection has a target replacement connection, the linear connection modeling unit 1070 creates a new connection of the target replacement type. The linear connection modeling unit 1070 may create attributes on the new simplified connection and may map the connection attributes from the original high fidelity connection onto the attributes of the new connection using rules that are defined by the system for all possible connection replacement pairings, including the parts/elements/nodes/features that are to be connected and the stiffness/damping characteristics of the connection. In many cases, the mapping process will be "lossy", in which some characteristics of the high fidelity representation may be lost during mapping because the simpler connection does not support that behavior.

The outputs of the execution of the input data by the linear connection modeling unit 1070 include the newly created connections and all supporting attributes and parameters. Additionally, all existing high fidelity connections, attributes and parameters may be retained and output for use in future high fidelity simulations.

Many high fidelity simulations include nonlinear behaviors as part of the model and solution. However, nonlinear solutions require an iterative solution approach which typically involves solution of multiple increments or steps to simulate the behavior of the structure from initial to final loading condition. Each increment or iteration can be a substantial compute problem and may require a significant amount of compute time and resource. A significant reduction in simulation time can usually be gained by using a linear representation of the model in place of a nonlinear representation and in many cases the linear representation is able to provide insight into the validity of the model, making it an ideal "initial try" to debug and validate new models prior to using them for full, high fidelity nonlinear simulations.

Nonlinear effects typically arise from three sources:
1) Material nonlinearity—where the relationship between stress and strain cannot be accurately represented by a linear model.
2) Large displacement/rotation effects—where the parts of the model undergo large displacement and/or rotations rendering the time saving small angle assumptions invalid and requiring the use of an iterative approach to ensure accurate behavior prediction.
3) Contact effects—where the "stiffness" between regions of the model can undergo large changes dependent on the relative locations of touching bodies. (Initially the bodies may not be touching and the stiffness between the is zero and later they may come into contact causing a high stiffness to exist between the same bodies)

In general, replacing nonlinear material models with linear material models and directing the solver to ignore large deformation/rotation effects can result in models that have some use in the model validation process. However, there is no simulation approach that can easily be a applied to replace contact with a linear simulation alternative, and therefore simplification of contact definitions requires an alternate approach.

As such, the creation of linear models from nonlinear models as performed by the linear modeling unit 1090 is described in detail below, to speed up the simulation time. The inputs to the linear modeling unit 1090 may include material properties, contact definitions and solution settings.

The processing of the input data by the linear modeling unit 1090 is described in detail below. For each nonlinear material in the model, the linear modeling unit 1090 may automatically generate a new linear elastic material definition based on the initial slope of the nonlinear material stress strain curve and substitutes that definition in place of the original nonlinear material definition. For each solution setting that invokes large deformation/rotation behavior, the linear modeling unit 1090 may automatically generate a new/alternate setting that invokes small deformation/rotation behavior. For each contact definition in the model, the linear modeling unit 1090 may automatically generate a new, simplified contact definition that results in reduced run times. This is achieved, for example, by removing all friction effects, relaxing contact stiffness parameters, relaxing overclosure limits between contacting bodies and in general adjusting all parameters and attributes of the contact model to ensure the most rapid solution convergence, at the expense of contact accuracy.

The outputs of the linear modeling unit 1090 may include new linear material definitions, new small displacement/rotation solution parameters and optionally new contact parameter sets. The original definitions of these properties and attributes may also be retained and output for future use.

Each of the above examples with respect to the different types of modeling units start with a "higher fidelity" representation of a model and produce one or more "lower fidelity" model representations. This means that the complete "Model" may include more objects than are required to represent the product that is being simulated. For example, some objects may have multiple representations—fine mesh and coarse mesh, linear and nonlinear materials etc. For any simulation to be valid, there can only be a single representation of each object, and so each global model simplification (each of the multiple fidelities) is actually a subset of the complete Model, which can be considered to be a series of "Model Configurations". That is, the original, high fidelity representation with fine mesh, nonlinear materials, high accuracy contact and sophisticated connections is one configuration that points to the high fidelity representations of each of the modeling objects, whereby each lower fidelity model configuration also points to a complete set of objects, but whereby it points to some lower level fidelity model of each object. Each simplification can be performed on an object by object basis.

The finite element modeling unit 1020 iterates the five basic steps of the finite element model a plurality of times, and uses the results obtained from the simpler models for the more complex models based on the user input of which models (e.g., simple model or more complex model) to use, and outputs modeling results to an output unit 1098, for display to the user.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-Ray disc where disks usually reproduce data magnetically, while discs reproduce data optically with lasers. Combinations of the above should also be included within the scope of computer-readable media.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A method of performing computer simulations, comprising:
   generating a first simulation model corresponding to a physical object from a second simulation model corresponding to the physical object by simplifying the second simulation model to obtain the first simulation model, wherein simplifying the second simulation model to obtain the first simulation model comprises at least one of:
      creating a rigid body model from a flexible body model, wherein the first simulation model is the rigid body model, and the second simulation model is the flexible body model;
      creating linear connections from non-linear connections, wherein the first simulation model comprises the linear connections, and the second simulation model comprises the non-linear connections; or
      creating a linear model from a non-linear model, wherein the first simulation model is the linear model, and the second simulation model is the non-linear model;
   executing a first simulation based on the first simulation model to obtain first results; and
   executing a second simulation based on a third simulation model and the first results.

2. The method of claim 1, wherein the third simulation model is generated from the second simulation model by simplifying the second simulation model, wherein the first simulation model is simpler than the third simulation model.

3. The method of claim 1, wherein the first simulation and the second simulation are executed sequentially.

4. The method of claim 1, wherein at least a portion of the first simulation and at least a portion of the second simulation are executed simultaneously.

5. The method of claim 4, wherein executing the second simulation comprises:
   executing a portion but not all of the second simulation; and
   re-executing the second simulation after obtaining the first results.

6. The method of claim 1, wherein:
   the first simulation model is a coarse mesh model;
   the second simulation model is a fine mesh model; and
   simplifying the second simulation model to obtain the first simulation model comprises creating the coarse mesh model from the fine mesh model.

7. The method of claim 1, wherein simplifying the second simulation model to obtain the first simulation model comprises receiving the second simulation model as input and outputting the first simulation model.

8. The method of claim 2, further comprising executing a fourth simulation based on the first simulation model, wherein the second simulation model is being simplified to obtain the third simulation model while the fourth simulation is executed.

9. A non-transitory computer-readable medium storing computer program product, which, when executed by a computer, causes the computer to execute computer simulations, comprising:
   generating a first simulation model corresponding to a physical object from a second simulation model corresponding to the physical object by simplifying the second simulation model to obtain the first simulation model, wherein simplifying the second simulation model to obtain the first simulation model comprises one of:
      creating a rigid body model from a flexible body model, wherein the first simulation model is the rigid body model, and the second simulation model is the flexible body model;
      creating linear connections from non-linear connections, wherein the first simulation model comprises the linear connections, and the second simulation model comprises the non-linear connections; or
      creating a linear model from a non-linear model, wherein the first simulation model is the linear model, and the second simulation model is the non-linear model;
   executing a first simulation based on the first simulation model to obtain first results; and
   executing a second simulation based on a third simulation model and the first results.

10. The non-transitory computer-readable medium of claim 9, wherein the third simulation model is generated from the second simulation model by simplifying the second simulation model, wherein the first simulation model is simpler than the third simulation model.

11. The non-transitory computer-readable medium of claim 9, wherein the first simulation and the second simulation are executed sequentially.

12. The non-transitory computer-readable medium of claim 9, wherein at least a portion of the first simulation and at least a portion of the second simulation are executed simultaneously.

13. The non-transitory computer-readable medium of claim 12, wherein executing the second simulation comprises:
   executing a portion but not all of the second simulation; and
   re-executing the second simulation after obtaining the first results.

14. An apparatus for executing computer simulations to simulate behaviors of a physical object, comprising:
   a receiving unit;
   a memory; and
   a processor configured to:
      generate a first simulation model corresponding to a physical object from a second simulation model corresponding to the physical object by simplifying the second simulation model to obtain the first simulation model, wherein simplifying the second simulation model to obtain the first simulation model comprises one of:
creating a rigid body model from a flexible body model, wherein the first simulation model is the rigid body model, and the second simulation model is the flexible body model;
creating linear connections from non-linear connections, wherein the first simulation model comprises the linear connections, and the second simulation model comprises the non-linear connections; or
creating a linear model from a non-linear model, wherein the first simulation model is the linear model, and the second simulation model is the non-linear model;
execute a first simulation based on the first simulation model to obtain first results; and
execute a second simulation based on a third simulation model and the first results.

\* \* \* \* \*